United States Patent [19]
Ohi

[11] Patent Number: 5,214,328
[45] Date of Patent: May 25, 1993

[54] ECL TO CMOS LEVEL CONVERSION CIRCUIT

[75] Inventor: Susumu Ohi, Tokyo, Japan
[73] Assignee: NEC Corporation, Tokyo, Japan
[21] Appl. No.: 722,564
[22] Filed: Jun. 27, 1991

[30] Foreign Application Priority Data

Jun. 27, 1990 [JP] Japan .................. 2-168934

[51] Int. Cl.$^5$ .................. H03K 17/14; H03K 17/094
[52] U.S. Cl. .................. 307/475; 307/296.7; 307/455; 307/451
[58] Field of Search .................. 307/475, 296.7, 455, 307/451

[56] References Cited

U.S. PATENT DOCUMENTS

| | | | |
|---|---|---|---|
| 4,068,140 | 1/1978 | Lou | 307/475 |
| 4,275,313 | 6/1981 | Boll et al. | 307/475 |
| 4,453,095 | 6/1984 | Wrathall | 307/475 |
| 4,563,601 | 1/1986 | Asano et al. | 307/475 |
| 4,763,021 | 8/1988 | Stickel | 307/475 |
| 4,968,905 | 11/1990 | Sanwo et al. | 307/475 |
| 5,075,579 | 12/1991 | Ueno | 307/475 |

*Primary Examiner*—Edward P. Westin
*Assistant Examiner*—Richard Roseen
*Attorney, Agent, or Firm*—Sughrue, Mion, Zinn, Macpeak & Seas

[57] ABSTRACT

A level conversion circuit includes an input buffer receiving an ECL level signal, a current mirror circuit receiving the output of the input buffer and a reference voltage and providing a converted CMOS level output signal, and a reference voltage generating circuit. The reference voltage generating circuit includes either a circuit for simulating at least portions of the input buffer, or it includes a circuit for providing a reference voltage to the current mirror circuit which varies in accordance with the level of the input signal.

10 Claims, 6 Drawing Sheets

ECL TO CMOS LEVEL CONVERSION CIRCUIT

FIELD OF THE INVENTION

This invention relates to a level conversion circuit which converts a signal of ECL (emitter-coupled logic) level to CMOS (complementary metal-oxide semiconductor) level.

BACKGROUND OF THE INVENTION

First and second conventional level conversion circuits are described on pages 184 and 185 of ISSCC DIG., Feb. 1989, respectively.

Both of the first and second conventional level conversion circuits comprise an input buffer circuit and a cascade current mirror circuit, respectively.

In the first conventional level conversion circuit, the input buffer circuit comprises four NPN bipolar transistors, three constant current sources, etc. to provide a current switch and two emitter-follower circuits, and the cascade current mirror circuit comprises two P channel MOSFETs and two N channel MOSFETs. Later, the detail of the circuit structure will be explained.

In operation, when a high level input signal of the ECL level is applied to an input terminal connected a base of the NPN bipolar transistor of the current switch in the input buffer circuit, a low level output signal of the CMOS level is from an output terminal connected to a common drain of the P and N channel MOSFETs in the cascade current mirror circuit. Later, the detail of this operation will be explained.

In the second conventional level conversion circuit, the input buffer circuit comprises three NPN bipolar transistors, two constant current sources to provide a current switch and an emitter-follower circuit, and the cascade current mirror circuit comprises two P channel MOSFETs and two N channel MOSFETs, although the circuit structure is slightly different from that of the first conventional level conversion circuit, as also will be explained later.

In operation, a high level input signal of the ECL level is converted to a high level output signal of the CMOS level in this second conventional level conversion circuit as different from the level conversion of the first conventional level conversion circuit. Later, the detail of this operation will be also explained.

However, the first conventional level conversion circuit has a disadvantage in that a rise time of an output signal of the CMOS level is delayed. This disadvantage is caused by the following reason. That is, it is necessary that the transistors of the current switch are not saturated in the input buffer circuit to provide a high speed level conversion operation. For this purpose, an amplitude of an output signal supplied from the input buffer circuit can be approximately 1.2 V at the highest level, so that the output signal of the input buffer circuit will be "$V_{cc}-V_f$" as positive, and "$V_{cc}-V_f-1.2$ V" as complementary, where $V_{cc}$ is a power supply voltage of the input buffer circuit, and $V_f$ is a forward ON voltage between emitter and base of the transistors of the emitter-follower circuits. As a result, a voltage of "1.2 V+$V_f-V_t$" is applied across source and gate of the P channel MOSFET on the ON side of the cascade current mirror circuit, where $V_t$ is a threshold voltage of the MOSFET. Consequently, a voltage of approximately 1.2 V is only applied across the gate and source of the P channel MOSFET on the output side of the cascade current mirror circuit at the highest level, so that a current flowing through the output side P channel MOSFET can not be larger than a certain level to result in the aformentioned disadvantage.

Further, the second conventional level conversion circuit has disadvantages in that a fall time of an output signal of the CMOS level is delayed, and a low level of the output signal is floated above a predetermined level to result in the difficulty that a gate voltage of the P channel MOSFET on the output side of the cascade current mirror circuit is not properly set. These disadvantages are caused by the following reason. That is, an ON current flowing through the P channel MOSFET on the output side of the cascade current mirror circuit can be large in the decrease of a gate voltage applied thereto under the condition that an amplitude of an output signal of the input buffer circuit is not increased. On the contrary, when the gate voltage is decreased, a large current flows therethrough to result in the aforementioned disadvantages, even if the P channel MOSFET is turned off.

The second conventional level conversion circuit has an additional disadvantage in that an adequate gate voltage applied to the P channel MOSFET on the output side of the cascade current mirror circuit is fluctuated due to the fluctuation of an output voltage of the input buffer circuit which is caused by the dispersion of manufacturing condition, the deviation of a power supply voltage, etc.

SUMMARY OF THE INVENTION

Accordingly, it is an object of the invention to provide a level conversion circuit providing an output signal with a short rise time and a short fall time.

It is a further object of the invention to provide a level conversion circuit operating stably without being affected by instabilities of a level of power supply voltage and manufacturing processes.

According to the invention, a level conversion circuit comprises:

an input buffer circuit which comprises a current switch composed of bipolar transistors and is supplied with an input signal of ECL (emitter-coupled logic) level;

a current mirror circuit comprising a MOSFET (metal-oxide semiconductor field effect transistor) which applied at a source with a voltage signal from the input buffer circuit and applied at a gate with a predetermined voltage, and the MOSFET supplies an output signal converted from ECL level into CMOS (complementary metal-oxide semiconductor) level from a drain thereof; and means for controlling the predetermined voltage so that a lower voltage is applied to the gate of the MOSFET in ON state, and a higher voltage is applied to the gate of the MOSFET in OFF state.

BRIEF DESCRIPTION OF THE DRAWINGS

The invention will be explained in more detail in conjunction with appended drawings; wherein.

DESCRIPTION OF THE PREFERRED EMBODIMENTS

Before describing a level conversion circuit according to the invention, the conventional level conversion circuits briefly described before will be explained in conjunction with FIGS. 1 and 2.

Figure 1:
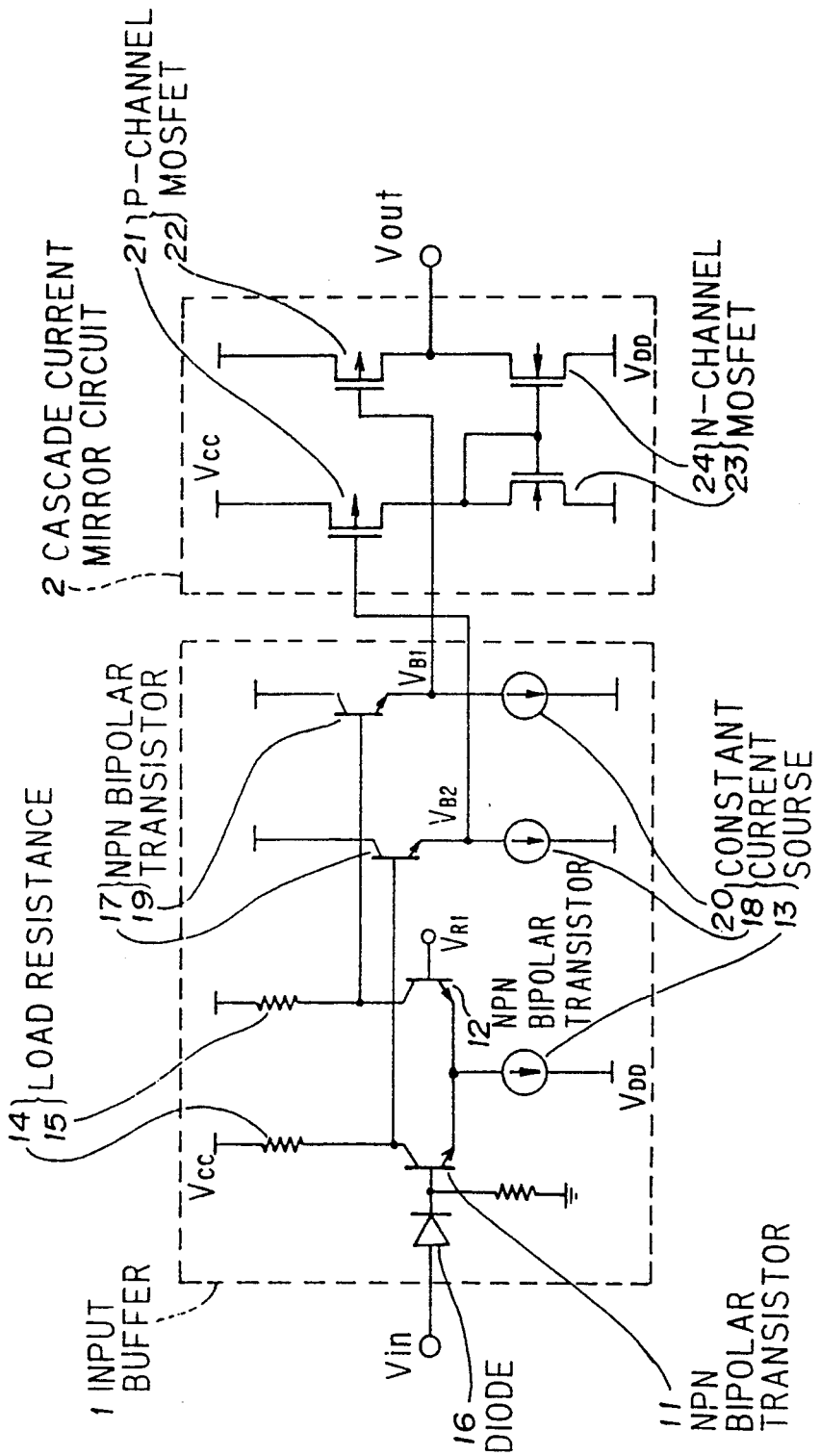
FIG. 1 is a circuit diagram showing a first conventional level conversion circuit.

FIG. 1 shows the first conventional level conversion circuit (ISSCC DIG., pp. 184-185, Feb. 1988). The level conversion circuit consists of an input buffer circuit 1 supplied with an input signal of the ECL level and a cascade current mirror circuit 2 supplying an output signal of the CMOS level to a following stage.

The input buffer circuit 1 includes differential amplifier comprising (11~13) and two emitter-follower circuits (17~20). The differential amplifier comprises a current switch consisting of two NPN bipolar transistors 11 and 12 which have a common emitter to compose a pair of differential transistors, and a constant current source 13 connected between the common emitter of the differential transistor pair 11 and 12 and a voltage source $V_{DD}$, with the differential amplifier further including load resistance 14 and 15 connected between collectors of the transistors 11 and 12 and voltage sources $V_{CC}$. The NPN bipolar transistor 11 is applied via a diode 16 at a base with an input signal $V_{in}$ of the ECL level, and the NPN bipolar transistor 12 is applied at a base with a reference voltage $V_{RI}$. The transistors 11 and 12 are connected to the emitter-follower circuits 17~20, respectively. One of the emitter-follower circuits consists of an NPN bipolar transistor 17 and a constant current source 18, and the other emitter-follower circuit consists of an NPN bipolar transistor 19 and a constant current source 20.

The cascade current mirror circuit 2 consists of P-channel MOSFETs 21 and 22 and N-channel MOSFETs 23 and 24. The P-channel MOSFET 21 and the N-channel MOSFET 23, and the P-channel MOSFET 22 and the N-channel MOSFET 24 are cascaded between voltage sources $V_{CC}$ and $V_{DD}$, respectively The P-channel MOSFETs 21 and 22 are respectively applied at gates with the voltage signals $V_{B1}$ and $V_{B2}$ from the input buffer circuit 1. The cascade current mirror circuit 2 supplies an output signal $V_{out}$ from a common drain of the MOSFETs 22 and 24.

In the first conventional level conversion circuit, when the input signal $V_{in}$ of high level is supplied to the input buffer circuit 1, a signal of high level is supplied from the transistor 19 of the emitter-follower circuit to the P-channel MOSFET 22, so that the MOSFET 22 turns OFF. Thus, the output signal $V_{out}$ of low level is supplied from the current mirror circuit 2.

On the other hand, when the input signal $V_{in}$ of low level is supplied to the input buffer circuit 1, a signal of low level is supplied from the transistor 19 of the emitter-follower circuit to the MOSFET 22, so that MOSFET 22 turns ON state. Thus, the output signal $V_{out}$ of high level is supplied from the current mirror circuit 2.

In this first conventional level conversion circuit, ON and OFF states of the transistors are described in the following table.

| $V_{in}$ TRANSISTOR | HIGH | LOW |
|---|---|---|
| 11 | ON | OFF |
| 12 | OFF | ON |
| 17 | ON | ON |
| 19 | ON | OFF |
| 21 | ON | OFF |
| 22 | OFF | ON |
| 23 | ON | OFF |
| 24 | ON | OFF |
| $V_{out}$ | LOW | HIGH |

Figure 2:
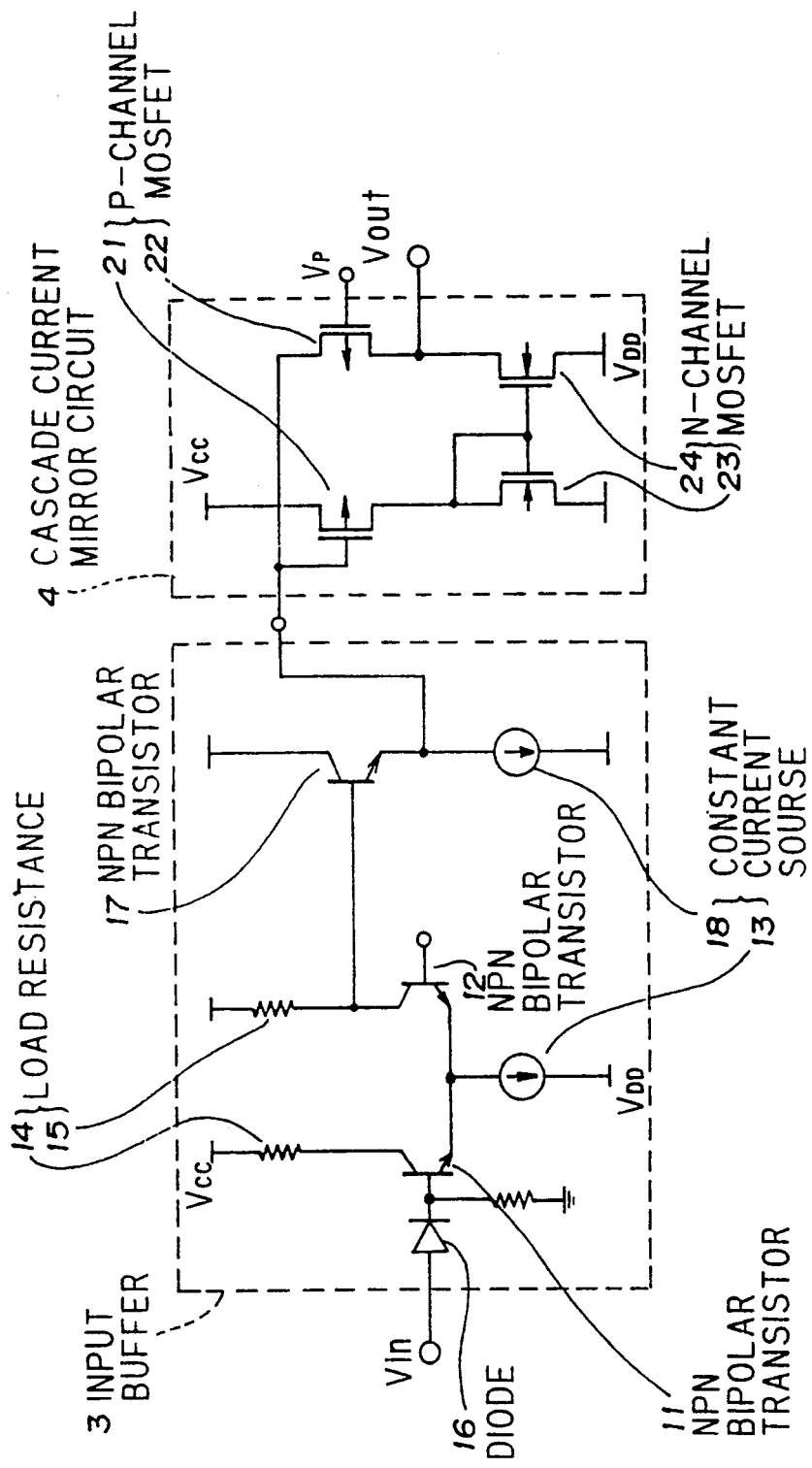
FIG. 2 is a circuit diagram showing a second conventional level conversion circuit.

FIG. 2 shows the second conventional level conversion circuit (ISSCC DIG., pp. 32-33, Feb. 1989). The level conversion circuit consists of an input buffer circuit 3 supplied with an input signal $V_{in}$ of the ECL level and a cascade current mirror circuit 4 supplying an output signal $V_{out}$ of the CMOS level to a following stage. The second conventional level conversion circuit corresponds approximately to the first conventional level conversion circuit shown in FIG. 1 with a small difference therebetween. That is, the input buffer circuit 3 includes only one emitter follower circuit composed of an NPN bipolar transistor 17 and a constant current source 18. The input buffer circuit 3 is connected to a P-channel MOSFET 21 and to be source of a P-channel MOSFET 22. In the current mirror circuit 4, the P-channel MOSFET 22 is applied at a gate with a predetermined gate voltage $V_P$.

In the second conventional level conversion circuit, when the input signal $V_{in}$ of high level is supplied to the input buffer circuit 3, the MOSFET 22 turns ON, so that the output signal $V_{out}$ of high level is supplied from the current mirror circuit 4. On the other hand, when the input signal $V_{in}$ of low level is supplied to the input buffer circuit 3, the MOSFET 22 turns OFF so that the output signal $V_{out}$ of low level is supplied from the current mirror circuit 4.

Figure 3:
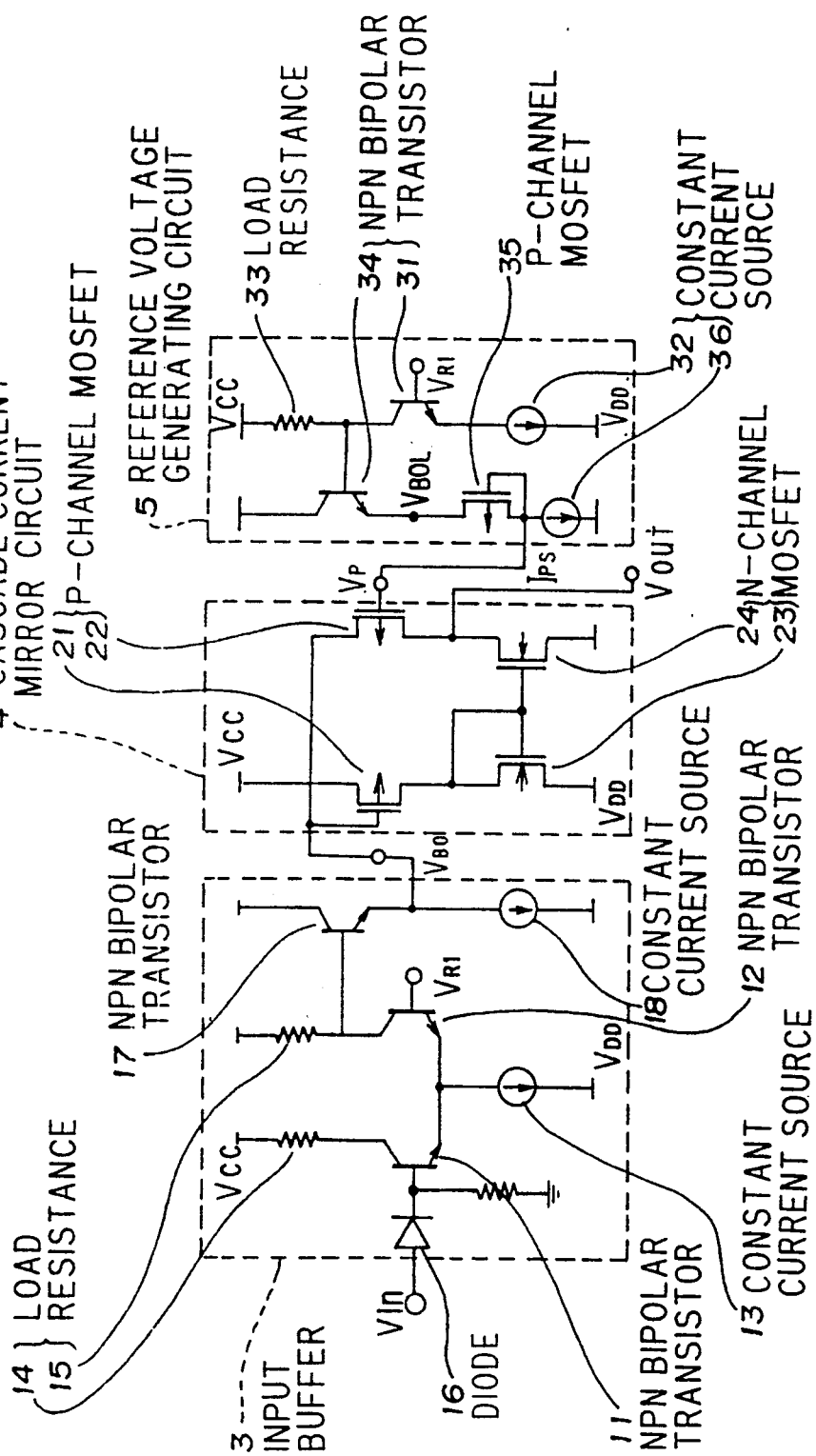
FIG. 3 is a circuit diagram showing a level conversion circuit of a first preferred embodiment according to the invention.

Next, FIG. 3 shows a level conversion circuit of a first preferred embodiment according to the invention. In this embodiment, an explanation of the same construction as the second conventional circuit shown in FIG. 2 is omitted. The level conversion circuit includes a reference voltage generating circuit 5 for applying a gate voltage $V_D$ to a gate of a P-channel MOSFET 22, in addition to the input buffer circuit 3 and the cascade current mirror circuit 4 as explained in the second conventional level conversion circuit.

The reference voltage generating circuit 5 includes a simulation circuit to simulate a differential amplifier (11~15) and an emitter follower circuit (17 and 18) in the input buffer circuit 3. The simulation circuit consists of an NPN bipolar transistor 31 applied at a base with a reference voltage $V_{RI}$, a constant current source 32 connected between the transistor 31 and a voltage source $V_{DD}$, a load resistance 33 connected between the transistor 31 and a voltage source $V_{CC}$, and an NPN bipolar transistor 34 connected at a base with a collector of the transistor 31. In the simulation circuit, the NPN bipolar transistor 31, the constant current source 32, the load resistance 33 and the NPN bipolar transistor 34, respectively, correspond to the transistor 12, the current source 13, the load resistance 15 and the transistor 17 in the input buffer circuit 3.

The reference voltage generating circuit 5 further includes a P-channel MOSFET 35 corresponding to the MOSFET 22 and a constant current source 36 connected between the MOSFET 35 and a voltage source $V_{DD}$. A gate and a drain of the MOSFET 35 are connected in common. A voltage at a node between the constant current source 36 and the MOSFET 35 is also applied to the gate of the P-channel MOSFET 22. A signal $I_{PS}$ is supplied to the gate of the MOSFET 22 to flow a small current through the MOSFET 22 by the fixed current source 36.

Figure 4:
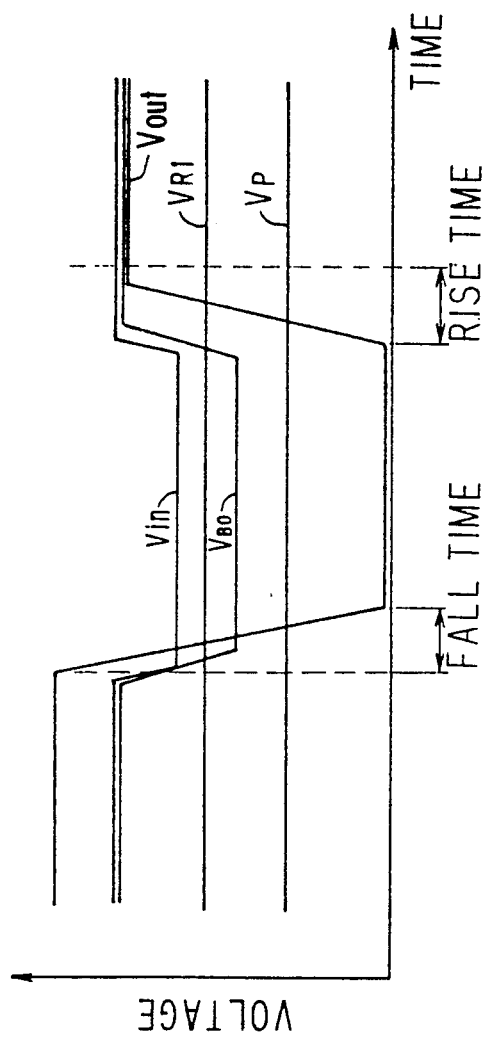
FIG. 4 is a timing chart showing operation in the first preferred embodiment shown in FIG. 3.

FIG. 4 is a timing chart showing operation in the first preferred embodiment.

In operation, when the input signal $V_{in}$ of high level is applied to the input buffer circuit 3, the transistor 11 turns ON and the transistor 12 turns OFF, then the transistor 17 becomes more conductive, so that the signal $V_{BO}$ becomes high. When the high level signal $V_{BO}$ is applied to the source of the P-channel MOSFET 22, the MOSFET 22 turns ON, so that the output signal $V_{out}$ rises. In this state, a large current flows through the MOSFET 22, because the gate voltage $V_P$ of low level is applied to the MOSFET 22. Therefore, the output signal $V_{out}$ rises with a short rise time.

When the input signal $V_{in}$ of low level is applied to the input buffer circuit 3, the transistor 11 turns OFF and the transistor 12 turns ON. Then, the transistor 17 becomes less conductive while still in the ON state, so that the signal $V_{BO}$ of low level is applied from the input buffer circuit 3 to the circuit 4. In response to the signal $V_{BO}$ of low level, the MOSFET 22 turns OFF, and the output signal $V_{out}$ falls. Then, the simulation circuit 31~33 in the reference voltage generating circuit 4 simulates a circuit composed of the transistor 12, the constant current source 13 and the load resistance 15 in the input buffer circuit 3. Further, the transistor 17 and the P-channel MOSFET 22 become the same condition as the transistor 34 and the P-channel MOSFET 35. In this condition, a high level the gate voltage $V_P$ is supplied to the P-channel MOSFET 22 by the fixed current source 36, so that a current flowing through the MOSFET 22 is controlled to be small in the OFF state. Therefore, the output signal $V_{out}$ falls with a short fall time.

In this first preferred embodiment, ON and OFF state of the transistors are described on the below table.

| $V_{in}$ TRANSISTOR | HIGH | LOW |
| --- | --- | --- |
| 11 | ON | OFF |
| 12 | OFF | ON |
| 17 | ON | ON |
| 21 | OFF | ON |
| 22 | ON | OFF |
| 23 | OFF | ON |
| 24 | OFF | ON |
| $V_{out}$ | HIGH | LOW |

As described above, even if the gate voltage $V_P$ is set low to shorten the rise time of the output signal $V_{OUT}$, the gate voltage $V_P$ is still high enough to ensure that the P-channel MOSFET 22 is OFF when $B_{BO}$ is low. Therefore, the fall time of the output signal $V_{OUT}$ is sufficiently shortened to the same extent as the rise time. Further, even if the level of the signal $B_{BO}$ is changed due to variations in manufacturing conditions or the like, the level of the gate voltage $V_P$ will be suitable, since it will vary in accordance with the same manufacturing conditions and will therefore track the variation of the voltage $V_{BO}$. Consequently, the level conversion circuit operates stably at all times.

Figure 5:
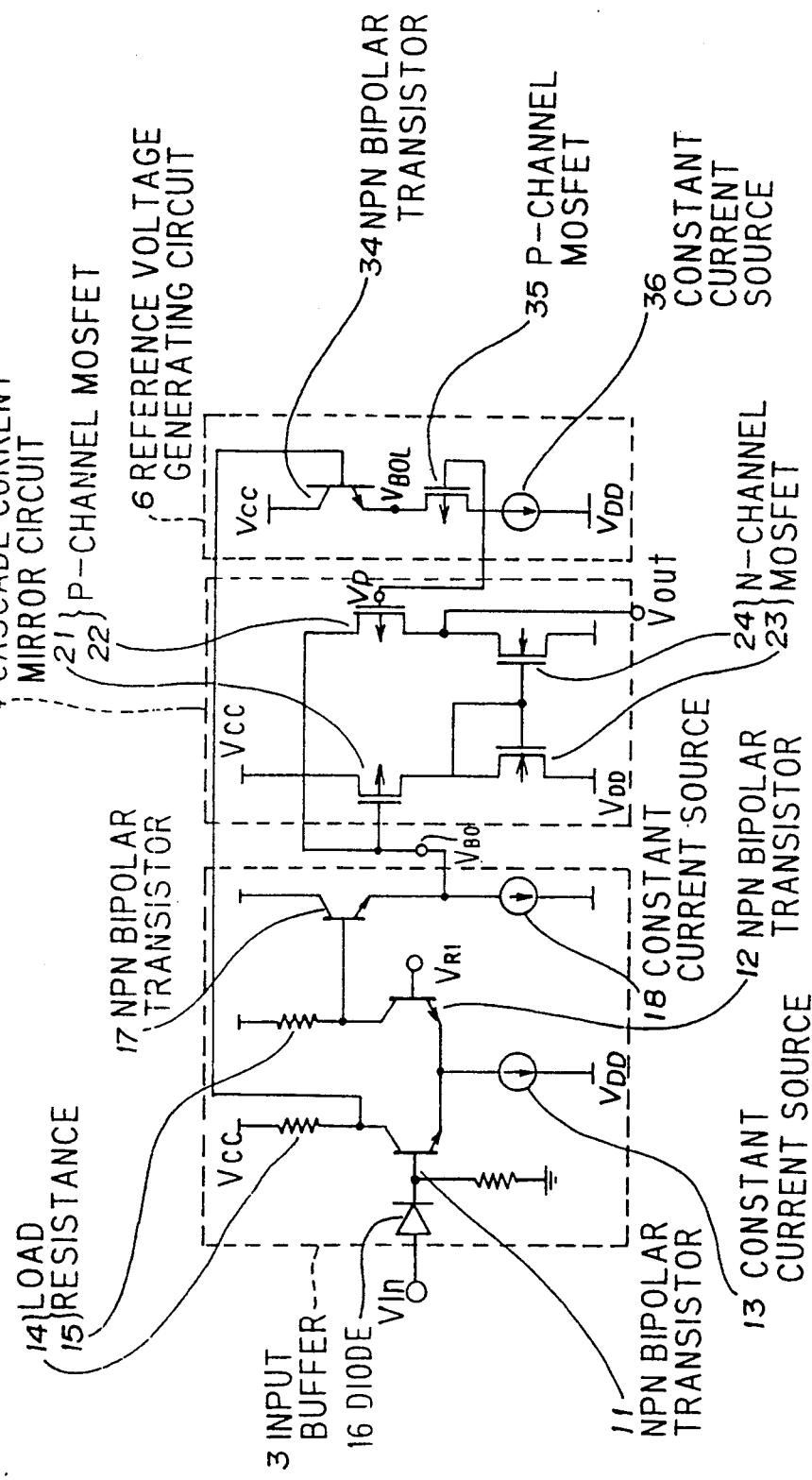
FIG. 5 is a circuit diagram showing a level conversion circuit of a second preferred embodiment according to the invention.

FIG. 5 shows a level conversion circuit of a second preferred embodiment according to the invention. In this embodiment, an explanation of the same construction as the first preferred embodiment shown in FIG. 3 is omitted. The level conversion circuit is provided with a reference voltage generating circuit 6 having a different construction from that of the first preferred embodiment. The reference voltage generating circuit 6 consists of an NPN bipolar transistor 34, a P-channel MOSFET 35 and a constant current source 36. The NPN bipolar transistor 34 is applied at a base with a collector voltage of an NPN bipolar transistor 11 in the input buffer circuit 3. The constant current source 36 is determined to supply a current slightly larger than that of the first preferred embodiment, so that the gate voltage $V_P$ respond to the input signal $V_{in}$ more quickly.

Figure 6:
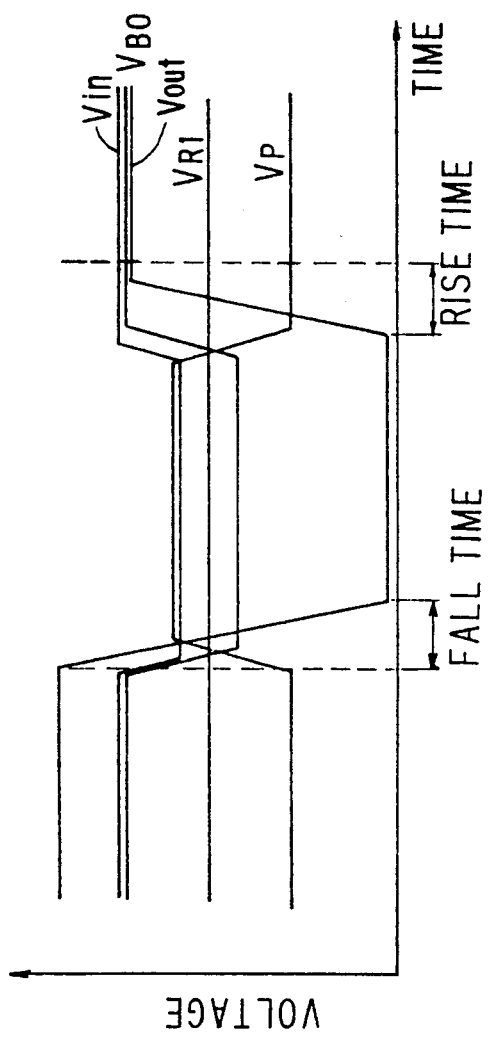
FIG. 6 is a timing chart showing operation in the second preferred embodiment shown in FIG. 5.

FIG. 6 is a timing chart showing operation in the second preferred embodiment. In this circuit, when the input signal $V_{in}$ of low level is applied to the input buffer circuit 3, the collector voltage of the transistor 11 becomes high, so that the transistor 34 becomes more conductive. Then a high level gate voltage $V_P$ is applied to the P-channel MOSFET 22, so that the MOSFET 22 turns OFF. On the other hand, when a high level input signal $V_{in}$ is supplied to the input buffer circuit 3, the transistor 11 turns ON, so that the transistor 34 become less conductive while ON. Then, a low level gate voltage Up is applied to the MOSFET 22, so that a large current flows through the MOSFET 22, and the output signal $V_{out}$ rises.

According to the second preferred embodiment, the gate voltage $V_P$ responds to the input signal $V_{in}$, and a number of elements is smaller than the first preferred embodiment.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A level conversion circuit, comprising:
    an input buffer comprising a bipolar transistor current switch, said input buffer receiving an ECL (emitter-coupled logic) level input signal and providing a buffer output which varies in level in accordance with variations in level of said input signal;
    a current mirror circuit receiving said buffer output and providing a level conversion circuit output in accordance with said buffer output, said current mirror circuit including an output MOSFET (metal-oxide semiconductor field effect transistor) with a source, gate and drain, said output MOSFET receiving said buffer output from said input buffer at said source and receiving a predetermined voltage at said gate, and said output MOSFET supplying at said drain a CMOS (complementary metal-oxide semiconductor) level output signal comprising said level conversion circuit output; and
    controlling means for controlling said predetermined voltage, so that a lower voltage is applied to said gate of said output MOSFET when said output MOSFET in an ON state, and a higher voltage is applied to said gate of said output MOSFET when said output MOSFET is in an OFF state.

2. A level conversion circuit, according to claim 1, wherein:

said controlling means comprises a simulation circuit for simulating said input buffer circuit, when said output MOSFET is in an OFF state; and means for generating said predetermined voltage in response to a signal supplied from said simulation circuit.

3. A level conversion circuit, according to claim 1, wherein said controlling means comprises means for changing said predetermined voltage in accordance with changes in said input signal.

4. A level conversion circuit, according to claim 2, wherein:

said generating means comprises a constant current source to supply a constant current to said gate of said output MOSFET.

5. A level conversion circuit, according to claim 3, wherein:

said generating means comprising a constant current source to supply a constant current to said gate of said output MOSFET.

6. A level conversion circuit, comprising:

an input buffer circuit, said input buffer comprising an emitter coupled logic (ECL) current switch for switching an ECL input signal and an emitter follower circuit driven by an output from said current switch and providing a buffer circuit output;

a cascade current mirror circuit, said current mirror circuit comprising a first MOSFET having a gate receiving said buffer circuit output, a second MOSFET having a gate and having a source receiving the output of said buffer circuit, and a current mirror circuit cascade connected to said first and second MOSFETs; and a reference voltage generating circuit comprising a simulating circuit for simulating the state of at least portions of said emitter follower circuit and current switch when an input signal is received by said input buffer in response to which an output from said input buffer turns said second MOSFET off, a third MOSFET driven by said simulating circuit and having operating characteristics similar to said second MOSFET, and a current limiting circuit for limiting the current flow through said third MOSFET;

wherein said gate of said second MOSFET is coupled to the gate of said third MOSFET and the drain of said second MOSFET provides a CMOS level output signal corresponding to said ECL input signal.

7. A level conversion circuit, comprising:

an input buffer circuit, said input buffer comprising an emitter coupled logic (ECL) current switch for switching an ECL input signal and an emitter follower circuit driven by an output from said current switch and providing a buffer circuit output;

a cascade current mirror circuit, said current mirror circuit comprising a first MOSFET having a gate receiving said buffer circuit output, a second MOSFET having a gate and having a source receiving the output of said buffer circuit, and a current mirror circuit cascade connected to said first and second MOSFETs; and a reference voltage generating circuit comprising a transistor which is turned on by an output of said current switch at a time when an input signal is received by said input buffer in response to which and output from said input buffer turns said second MOSFET off, a third MOSFET driven by the transistor and having operating characteristics similar to said second MOSFET, and a current limiting circuit for limiting the current flow through said third MOSFET;

wherein said gate of said second MOSFET is coupled to the gate of said third MOSFET and the drain of said second MOSFET provides a CMOS level output signal corresponding to said ECL input signal.

8. A level conversion circuit, comprising:

an input buffer comprising a bipolar transistor current switch, said input buffer receiving an ECL (emitter-coupled logic) level input signal and providing a buffer output which varies in level in accordance with variations in level of said input signal;

a level conversion unit including a first P-channel MOSFET (metal-oxide semiconductor field effect transistor) having a gate receiving said buffer output, a source connected to a reference voltage and a drain, a second P-channel MOSFET having a gate receiving a predetermined potential, a source receiving said buffer output and a drain, a first N-channel MOSFET having a gate coupled to said drain of said first P-channel MOSFET, a source coupled to a second reference potential and a drain coupled to said drain of said first P-channel MOSFET, and a second N-channel MOSFET having a gate coupled to said gate of said first N-channel MOSFET, a source coupled to said second reference potential and a drain coupled to said drain of said second P-channel MOSFET and providing a CMOS (complementary metal-oxide semiconductor) level output signal corresponding to said buffer output; and controlling means for controlling said predetermined potential, so that a lower voltage is applied to said gate of said second P-channel MOSFET when said second P-channel MOSFET is in an ON state, and a higher voltage is applied to said gate of said second P-channel MOSFET when said second P-channel MOSFET is in an OFF state.

9. A level conversion circuit, comprising:

an input buffer circuit for receiving an ECL (emitter-coupled logic) level input signal and providing a buffer output which varies in level in accordance with variations in level of said input signal;

a level conversion circuit for receiving said buffer output and a reference potential and responsive to said buffer output and reference potential for providing a CMOS (complementary metal-oxide semiconductor) level output signal corresponding to said buffer output; and a reference voltage generating circuit for supplying said reference voltage to said level conversion circuit with a level which varies in accordance with variations in the level of said input signal.

10. A level conversion circuit according to claim 6, wherein said simulating current switch and emitter follower circuit include a first bipolar transistor, a load resistor coupled to said first bipolar transistor and a second bipolar transistor coupled at its base to the junction between said load resistor and first bipolar circuit, and wherein said simulating circuit includes a first bipolar transistor, a load resistor coupled to said first bipolar transistor and a second bipolar transistor coupled at its base to the junction between said load resistor and first bipolar circuit, and wherein said first and second bipolar transistors of said current switch and simulating circuit are similar in operating characteristics.

* * * * *